United States Patent [19]

Anderson

[11] 4,103,194
[45] Jul. 25, 1978

[54] VOLTAGE GENERATORS

[75] Inventor: Antony Faithfull Anderson, Newcastle upon Tyne, England

[73] Assignee: Reyrolle Parsons Limited, England

[21] Appl. No.: 795,547

[22] Filed: May 10, 1977

[30] Foreign Application Priority Data

May 13, 1976 [GB] United Kingdom ............... 19830/76

[51] Int. Cl.$^2$ ............................................. H02K 13/14
[52] U.S. Cl. .................................. 310/68 D; 310/117
[58] Field of Search ................. 310/115, 116, 117, 40, 310/67, 68 R, 68 D; 322/49–52

[56] References Cited

U.S. PATENT DOCUMENTS

| 2,553,292 | 5/1951 | Barrett | 310/40 |
| 3,317,765 | 5/1967 | Cone | 310/67 |
| 3,549,919 | 12/1970 | Spisak et al. | 310/68 |

FOREIGN PATENT DOCUMENTS

| 143,886 | 1/1962 | U.S.S.R. | 310/117 |

*Primary Examiner*—Donovan F. Duggan
*Attorney, Agent, or Firm*—Holman & Stern

[57] ABSTRACT

A voltage generator comprising a first and a second mechanical system which systems are arranged for relative rotation to one another by means of a shaft incorporated in the first system being supported in bearings mounted in the second system, the shaft of the first system carrying an off-axis biassing weight of sufficient magnitude to restrain by gravitational force the first system from rotation when the shaft is horizontally orientated and the second system is rotated about an axis coincident with the shaft axis, a permanent magnet forming part of one of the systems and an armature winding being carried by the other whereby rotation of the second system about the first causes voltages to be induced in the armature winding.

5 Claims, 5 Drawing Figures

VOLTAGE GENERATORS

BACKGROUND OF THE INVENTION

This invention relates to means for generating a voltage and is particularly although not exclusively applicable to machines in turbogenerator installations for providing a power supply for telemetry purposes.

It is necessary for the operation and testing of turboalternators to monitor a number of rotor conditions existing when the machine is operating in order to determine whether the machine is operating within its design parameters. Such conditions include temperature, strain and dimensional variation. It is well known to employ telemetry equipment for this purpose with sensing equipment mounted on the rotor providing signals to a stationary receiver.

A power supply is therefore required on the machine rotor to energise the telemetry transmitter. Known methods of providing such a supply include batteries, which must be designed to withstand the high rotational forces to which they are subjected and which have only a limited life span, sliprings which can be difficult to locate and are subject to wear, and inductive couplings which, by their nature, have to be closely coupled to provide adequate power transfer leading to fouling problems caused by vibration.

SUMMARY OF THE INVENTION

The object of the present invention is to provide voltage generating means for the purpose described which is simple, reliable and economical in operation and manufacture.

The invention consists in a voltage generator comprising a first and a second mechanical system which systems are arranged for relative rotation to one another by means of a shaft incorporated in the first system being supported in bearings mounted in the second system, the shaft of the first system carrying an off-axis biassing weight of sufficient magnitude to restrain by gravitational force the first system from rotation when the shaft is horizontally orientated and the second system is rotated about an axis coincident with the shaft axis, a permanent magnet forming part of one of the systems and an armature winding being carried by the other whereby rotation of the second system about the first causes voltages to be induced in the armature winding.

The invention also consists in a voltage generator in accordance with the preceding paragraph in which the permanent magnet is part of the first mechanical system and is mounted on the shaft thereof whilst the armature winding is associated with a magnetic core forming part of the second mechanical system.

The invention also consists in a voltage generator in accordance with the first of the preceding two paragraphs in which the armature winding is associated with a magnetic core forming part of the first mechanical system whilst the permanent magnet forms part of the second mechanical system.

The armature winding of the generator when carried by the second mechanical system is preferably a three-phase winding from which a regulated d.c. voltage supply is derived by way of a rectifying bridge circuit and d.c. voltage regulator. Long-life bearings requiring no lubrication are preferably used for the shaft mounting.

In the arrangement where the permanent magnet is mounted on the second mechanical system the armature winding mounted on the shaft of the first mechanical system must be provided with sliprings or a commutator arrangement on the shaft to convey current from the generator. Direct current for operation of telemetry equipment may thereby be obtained without the need for a rectifying bridge circuit.

A voltage generator constructed in accordance with the present invention requires no electrical connections apart from those made to the portion of a telemetry system mounted on the rotor of a machine being monitored. The voltage generator may be positioned in a machine rotor co-axial with the machine rotor axis at a location close to the telemetry transmitter. This system permits a high power system of telemetry to be used having an improved signal-to-noise ratio as compared with previous battery powered systems.

BRIEF DESCRIPTION OF THE DRAWINGS

The invention will now be further described in a preferred form by way of example with reference to the accompanying drawings in which.

DETAILED DESCRIPTION OF A PREFERRED EMBODIMENT

Figure 1:
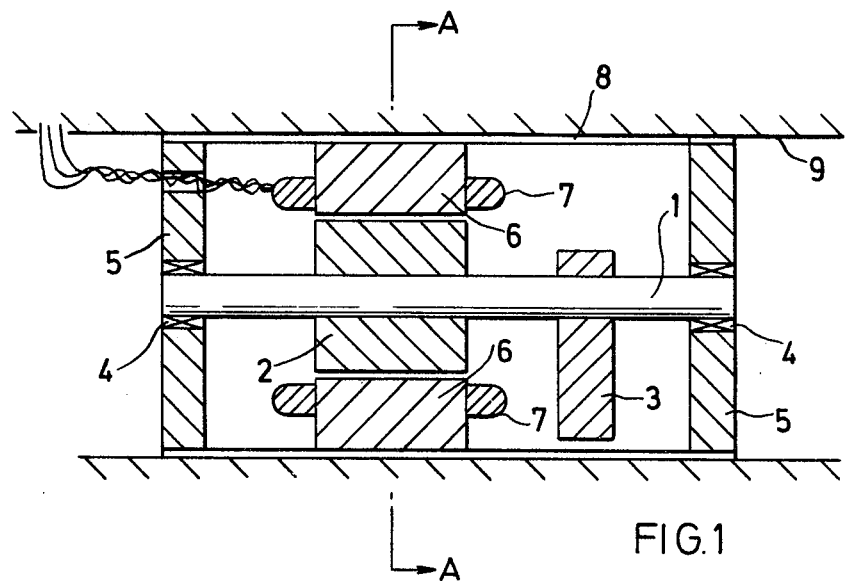
FIG. 1 is a part sectional side elevation of a voltage generator according to the present invention mounted in a cylindrical cavity in a machine rotor under observation.
Figure 2:
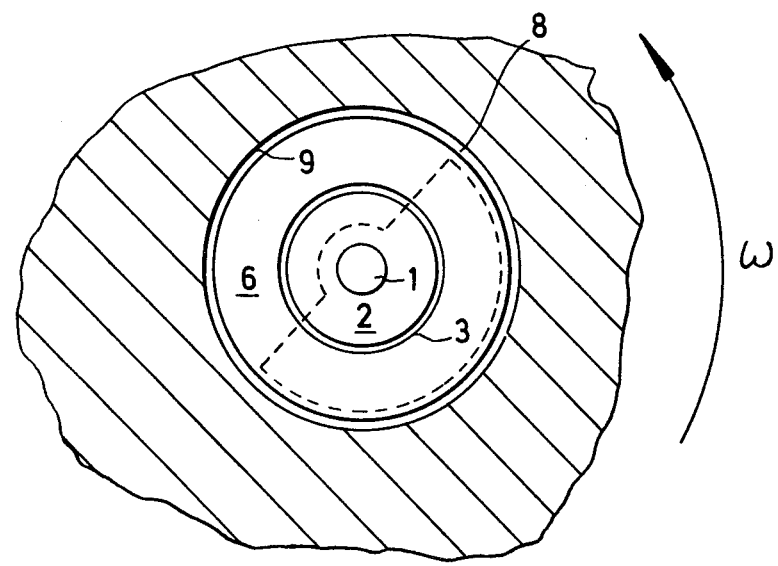
FIG. 2 is a cross-section of the arrangement shown in FIG. 1 taken at the line A–A.

Referring first to FIGS. 1 and 2, the voltage generator shown comprises a shaft 1 having rigidly mounted thereon a permanent magnet 2 and an off-axis biassing weight 3, the shaft 1, magnet 2 and weight 3 comprising a first mechanical system.

Shaft 1 is mounted by means of long-life bearings 4 in the end plates 5 of an armature system comprising an armature core 6 and a three-phase armature winding 7. The cylindrical casing 8 of the generator is fixedly mounted against the cylindrical wall 9 of a cylindrical boring in the rotor shaft of a machine, parameters on which rotor shaft are to be monitored by telemetry equipment (not shown). The casing 8, end plates 5, armature core 6 and its winding 7 together comprise a second mechanical system. The axis of shaft 1 is arranged to be co-axial with the machine rotor bore.

Figure 3:
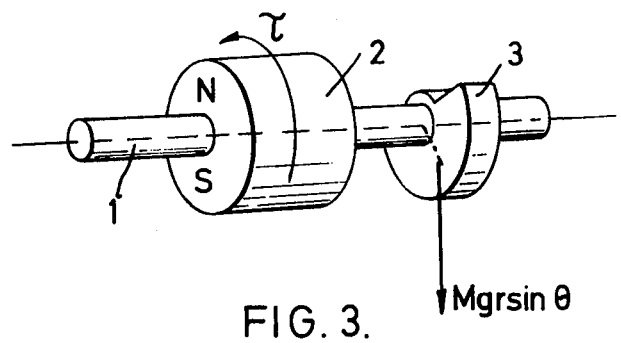
FIG. 3 shows an isometric view of the permanent magnet field system and off-axis biassing weight of the voltage generator shown in FIG. 1.
Figure 4:
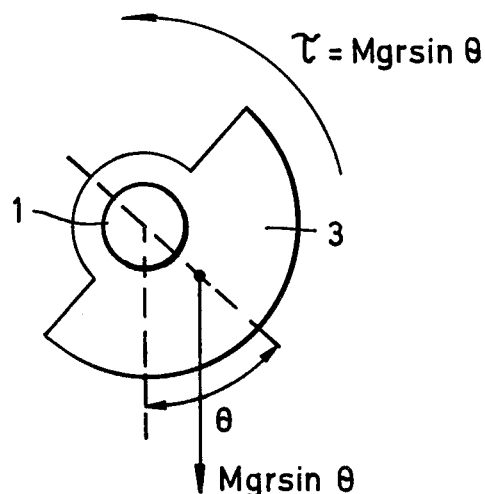
FIG. 4 indicates the equilibrium of forces applied to the biassing weight of the voltage generator of FIG. 1 when the generator is in operation.

Operation of the machine under observation causes its rotor to carry the armature core 6 and associated winding 7 around the field magnet 2 which is prevented from rotating by the action of gravity on the weight 3. Referring to FIGS. 3 and 4, armature reaction torque $\tau$ on the permanent magnet attempts to cause rotation of the magnet with the armature system, but once displacement from the non-operational position of the field system occurs a counteracting torque $M g r \sin \theta$ is provided by the weight 3, where:

M = mass of weight 3.

g = acceleration due to gravity.

r = displacement of the centre of mass of weight 3 from the shaft axis.

θ = angular displacement of weight 3 from the non-operational position (centre of mass of weight 3 vertically below shaft axis).

At equilibrium during operation of the voltage generator the counterbalancing torque opposes the sum of the windage and friction losses in addition to the electrical output (armature reaction torque) and resistance losses for the generator.

Figure 5:
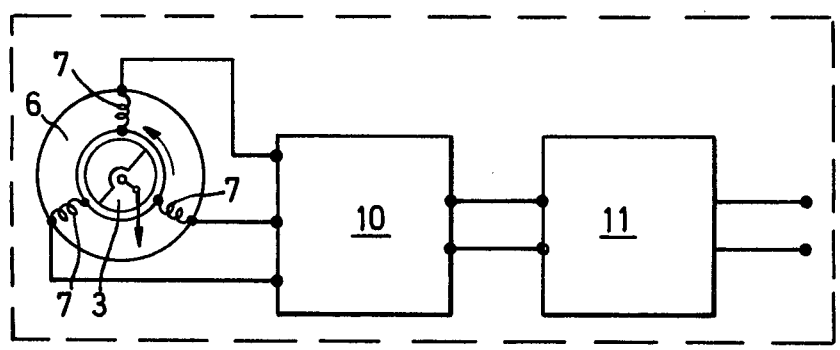
FIG. 5 shows a simplified block circuit diagram for a telemetry system power supply powered by the armature winding of a voltage generator according to the present invention.

Referring to FIG. 5, the resultant three-phase output of the armature winding is first rectified in a bridge rectifying circuit 10 and the rectified d.c. voltage from circuit 10 passes to a voltage regulating circuit 11. The output from circuit 11 is then connected to transmission telemetry circuitry on the machine shaft to supply the required d.c. power for transmission to receiving telemetry circuits (not shown) stationarily mounted external to the machine rotor under observation.

Voltage generators according to the invention are not limited to three-phase types and multi-phase or single-phase generators equally well fall within its scope. Applications of the generators are not limited to turbo-alternator rotor monitoring and can encompass a wide variety of rotating machine types.

Whilst in the specific embodiment of the invention described the permanent magnet field system is mounted on the shaft whilst the armature winding is arranged to rotate around it, the reverse disposition of armature winding and permanent magnet also fall within the scope of the invention. It is necessary in the latter case to provide means such as sliprings or a commutator to convey current from the armature winding. Employing a commutator in such arrangements enables a d.c. voltage to be generated directly without the requirement for rectification.

I claim:

1. In a battery replacement system for providing direct current to electrical equipment, an improvement comprising:
    a voltage generator incorporating first and second mechanical systems, said first system including a shaft supported by bearings mounted in said second system whereby said systems are arranged for relative motion to one another, and off-axis biasing weight carried on said shaft and having sufficient magnitude to restrain, by gravitational force, th first system from rotation when the shaft is horizontally oriented and the second system is rotated about an axis coincident with the shaft axis, a permanent magnet forming part of one of the systems, and an armature winding carried by the other whereby rotation of the second system about the first causes an alternating current to be induced in the armature winding; and
    a bridge rectifier circuit electrically connected to the armature winding for rectifying the alternating current into an unregulated direct current; and
    a voltage regulator electrically connected to said d.c. current of said bridge rectifier, said regulator providing a regulated direct current supply for said electrical equipment.

2. A voltage generator as claimed in claim 1, in which the permanent magnet is part of the first mechanical system and is mounted on the shaft thereof whilst the armature winding is associated with a magnetic core forming part of the second mechanical system.

3. A voltage generator as claimed in claim 2, in which the armature winding of the generator is a three-phase winding.

4. A voltage generator as claimed in claim 1, in which the armature winding is associated with a magnetic core forming part of the first mechanical system whilst the permanent magnet forms part of the second mechanical system.

5. A voltage generator as claimed in claim 4, in which the armature winding is provided means on the shaft to convey current from the generator.

* * * * *